United States Patent
Chen et al.

(10) Patent No.: US 6,828,226 B1
(45) Date of Patent: Dec. 7, 2004

(54) REMOVAL OF SION RESIDUE AFTER CMP

(75) Inventors: Kei-Wei Chen, Yung-Ho (TW); Kuo-Hsiu Wei, Banchiau (TW); Yu-Kin Lin, Hsin-chu (TW); Ting-Chun Wang, Taoyuan (TW); Ying-Lang Wang, Tien-chung Village (TW); Shih-Tzung Chang, Feugyuan (TW)

(73) Assignee: Taiwan Semiconductor Manufacturing Company, Limited, Hsin-Chu (TW)

( * ) Notice: Subject to any disclaimer, the term of this patent is extended or adjusted under 35 U.S.C. 154(b) by 48 days.

(21) Appl. No.: 10/042,573

(22) Filed: Jan. 9, 2002

(51) Int. Cl.[7] .......................................... H01L 21/4763
(52) U.S. Cl. ....................... 438/626; 438/633; 438/672; 438/692
(58) Field of Search ................................ 438/626, 633, 438/692, 672, 749, 750, 751, 906, 974, FOR 111, FOR 355

(56) References Cited

U.S. PATENT DOCUMENTS

| | | | |
|---|---|---|---|
| 5,679,169 A | 10/1997 | Gonzales et al. | 134/1.3 |
| 5,704,987 A | 1/1998 | Huynh et al. | 134/6 |
| 5,981,454 A | 11/1999 | Small | 510/175 |
| 6,022,751 A * | 2/2000 | Shindo et al. | 438/21 |
| 6,044,851 A | 4/2000 | Grieger et al. | 134/1.3 |
| 6,046,112 A | 4/2000 | Wang | 438/693 |
| 6,099,662 A | 8/2000 | Wang et al. | 134/26 |
| 6,114,241 A | 9/2000 | Choi et al. | 438/677 |
| 6,152,148 A | 11/2000 | George et al. | 134/2 |
| 6,194,366 B1 | 2/2001 | Naghshineh et al. | 510/175 |
| 6,235,145 B1 | 5/2001 | Li et al. | 156/345 |
| 6,376,361 B1 * | 4/2002 | Chooi et al. | 438/631 |
| 6,391,768 B1 * | 5/2002 | Lee et al. | 438/633 |
| 6,413,869 B1 * | 7/2002 | Achuthan et al. | 438/690 |
| 6,448,182 B1 * | 9/2002 | Hall et al. | 438/692 |
| 6,465,296 B1 * | 10/2002 | Quek et al. | 438/233 |
| 6,503,828 B1 * | 1/2003 | Nagahara et al. | 438/633 |
| 6,528,341 B1 * | 3/2003 | Schiavone et al. | 438/72 |
| 6,531,397 B1 * | 3/2003 | Nagahara et al. | 438/692 |
| 2003/0003754 A1 * | 1/2003 | Yokoi et al. | |
| 2003/0073286 A1 * | 4/2003 | Chiang et al. | |

* cited by examiner

*Primary Examiner*—George Fourson
*Assistant Examiner*—F. L. Toledo

(57) ABSTRACT

For 0.18 micron technology, it is common practice to use silicon oxynitride as an anti-reflective layer for defining the via etch patterns. It has however been found that, using current technology, residual particles of oxynitride get left behind. The present invention solves this problem by subjecting the surface from which the silicon oxynitride was removed to a high pressure rinse of an aqueous solution that includes a surfactant such as tetramethyl ammonium hydroxide or isopropyl alcohol. These surfactants serve to modify the hydrophobic behavior of the silicon oxynitride particles so that they no longer cling to the surface.

28 Claims, 2 Drawing Sheets

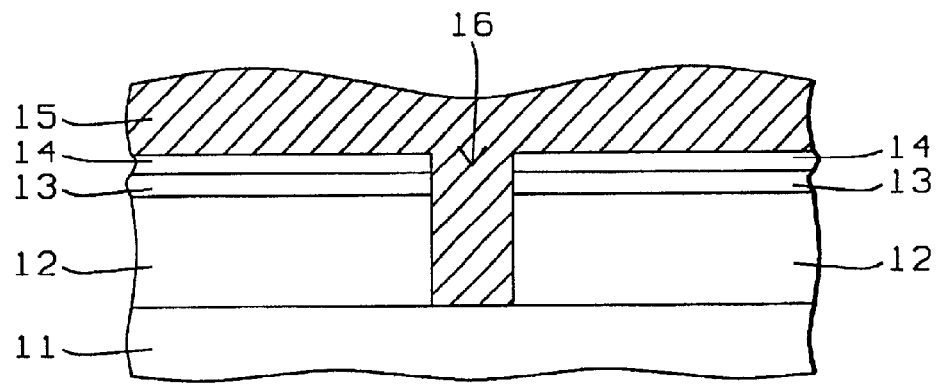
FIG. 1 – Prior Art
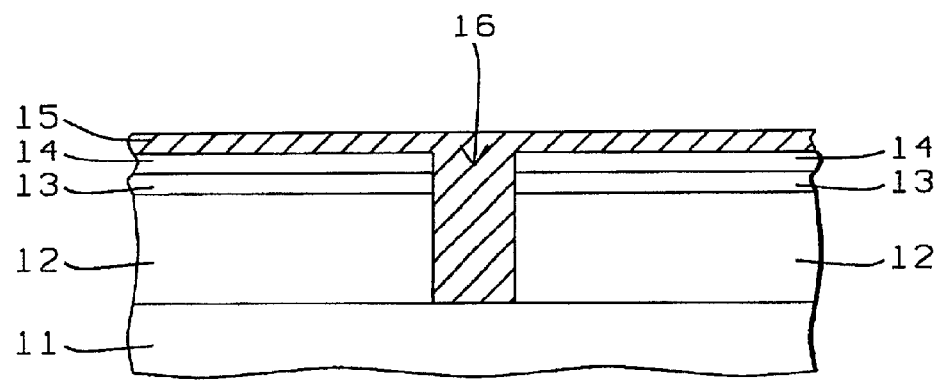
FIG. 2 – Prior Art
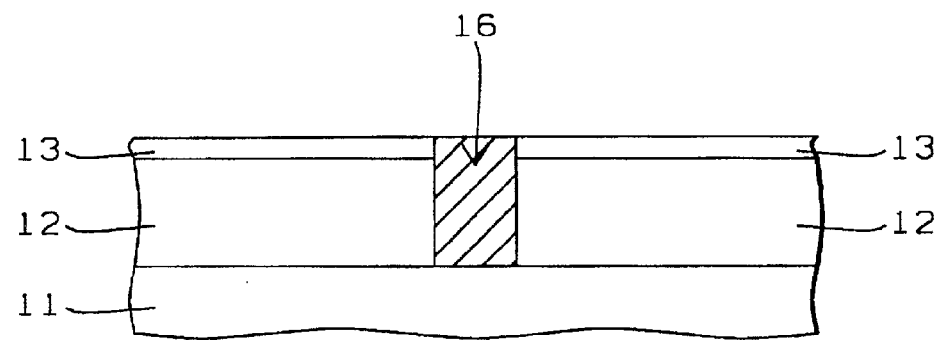
FIG. 3 – Prior Art

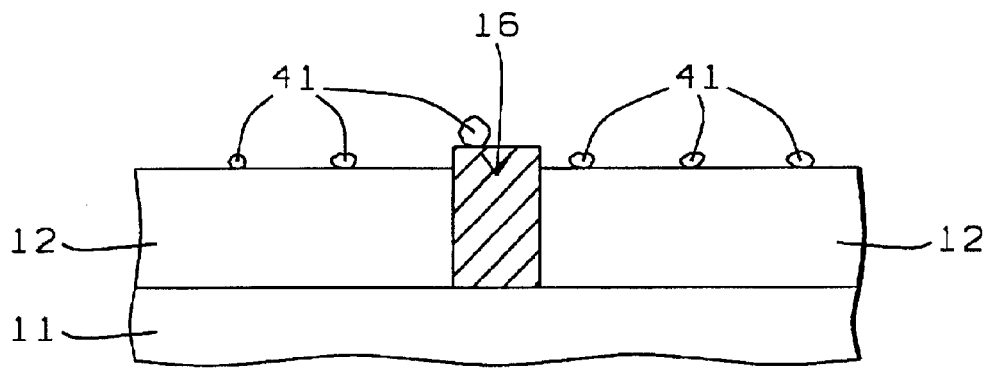
FIG. 4 – Prior Art
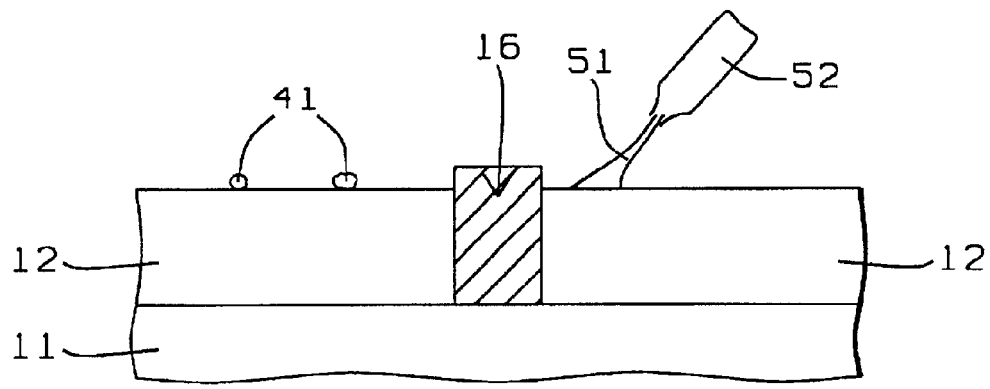
FIG. 5
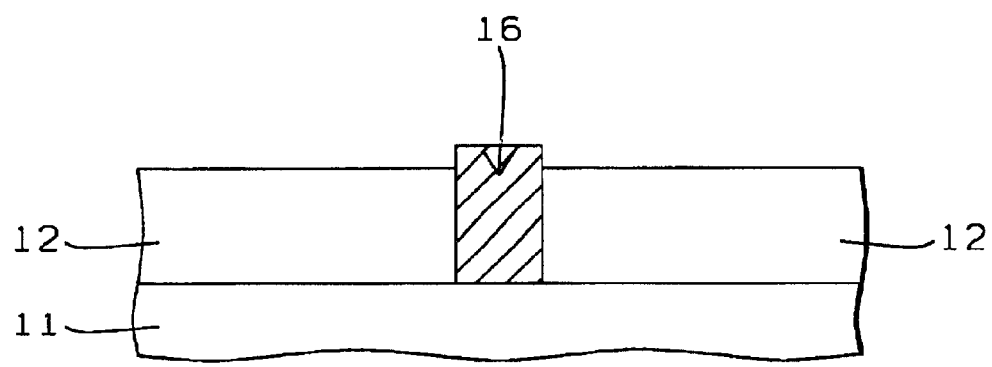
FIG. 6

REMOVAL OF SION RESIDUE AFTER CMP

FIELD OF THE INVENTION

The invention relates to the general field of chem. mech. polishing with particular reference to polishing surfaces of silicon oxynitride and the removal of all associated particle residue.

BACKGROUND OF THE INVENTION

Referring to FIG. 1, we note that, for certain technology families notably 0.18 micron logic, it is necessary to use a layer of silicon oxynitride 13 (in conjunction with a titanium nitride layer 14) to serve as a bottom anti-reflection coating (BARC) prior to coating with photoresist. This facilitates patterning of via holes, such as 16, that will be etched through an inter-metal dielectric layer 12. The latter sits on substrate 11 which is typically a layer of wiring. This would then be followed by over-filling the via holes with tungsten layer 15. The latter is then planarized by means of CMP (chemical mechanical polishing). Planarization is performed in two steps. First, most of the tungsten is removed, as shown in FIG. 2. The wafer is then moved to a different platen where titanium nitride layer 14 and the remaining tungsten are removed, as shown in FIG. 3.

It has, however, been found that tungsten CMP doesn't completely remove all silicon oxynitride from the surface and that a residue of silicon oxynitride particles get left behind. These are shown in FIG. 4 as particles 41 on the surface of dielectric layer 12. Several processes have been tried to cause the removal of the silicon oxynitride particles. For example, an extra step of de-ionized water (DIW)-buffing can usually achieve the removal of the particles but this is time consuming and requires another dedicated tool for the task. A process that can be added in situ to the existing process, rather than being part of a post CMP cleaning step, is also to be preferred.

A routine search of the prior art was performed with the following references of interest being found:

U.S. Pat. No. 5,704,987 (Huynh et al.) show a post CMP clean using TMAH (tetramethyl ammonium hydroxide). Naghshineh et al. in U.S. Pat. No. 6,194,366 B1 show a post CMP clean comprising TMAH. In U.S. Pat. No. 6,152,148, George et al. also show a post CMP clean that uses TMAH, as do Wang et al. in U.S. Pat. No. 6,099,662. U.S. Pat. No. 5,981,454 (Small), U.S. Pat. No. 6,044,851 (Grieger), U.S. Pat. No. 6,235,145 B1 (Li et al.), U.S. Pat. No. 6,046,112 (Wang), U.S. Pat. No. 6,114,241 (Choi et al.), and U.S. Pat. No. 5,679,169 (Gonzales et al.) describe Post CMP clean comprising TMAH.

SUMMARY OF THE INVENTION

It has been an object of at least one embodiment of the present invention to provide a process for CMP of a silicon oxynitride surface.

Another object of at least one embodiment of the present invention has been that said process should not lead to leaving a residue of silicon oxynitride particles on the surface from which the layer of silicon oxynitride was removed.

Still another object of at least one embodiment of the present invention has been that said process be readily incorporated as part of the standard process used for the formation of tungsten studs in silicon integrated circuits, particularly for the 0.18 micron logic family of circuits.

A further object of at least one embodiment of the present invention has been that said process not require additional specialized apparatus for its implementation.

These objects have been achieved by subjecting the surface from which the silicon oxynitride was removed to a high pressure rinse in an aqueous solution that includes a surfactant such as tetramethyl ammonium hydroxide or isopropyl alcohol. These surfactants serve to modify the hydrophobic behavior of the silicon oxynitride particles so that they no longer cling to the surface.

BRIEF DESCRIPTION OF THE DRAWINGS

FIG. 1 shows a dielectric layer through which a via hole has been etched, over-filled with tungsten prior to CMP.

FIG. 2 shows FIG. 1 after the tungsten layer has been planarized.

FIG. 3 shows FIG. 2 after the remaining tungsten and the titanium nitride are removed from the surface of the silicon oxynitride.

FIG. 4 is a schematic illustration showing how particles of silicon oxynitride remain clinging to the surface after removal of the silicon oxynitride.

FIG. 5 illustrates a key feature of the invention, namely cleaning the surface with a high pressure spray that includes a suitable surfactant.

FIG. 6 illustrates surface appearance after the process illustrated in FIG. 5.

DESCRIPTION OF THE PREFERRED EMBODIMENTS

As discussed above, the process of the present invention begins as shown in FIG. 1 where a layer of tungsten between about 0.3 and 0.5 microns thick is used to overfill the via. After a first CMP step, on a first platen, the tungsten thickness is reduced to between about 0.1 and 0.2 microns. This is followed by a second CMP step on a second platen during which the remaining tungsten and the immediately underlying titanium nitride layer are both removed. Then, in a third CMP step on a third platen, the layer of silicon oxynitride needs to be removed. As already noted, this step, using prior art methods, results in silicon oxynitride debris being left behind on the surface.

We have determined that the reason that silicon oxynitride particles tend to remain on the surface after the oxynitride has been removed by CMP is that silicon oxynitride is slightly hydrophobic. So a simple water rinse immediately after CMP is insufficient to pry the oxynitride debris off the wafer surface. We have therefore introduced the use of a surfactant into the process immediately after the CMP of the silicon oxynitride has been completed. This modifies the hydrophobic behavior of the oxynitride making its removal from the wafer surface easier.

Two surfactants, TMAH and isopropyl alcohol (IPA), were evaluated although similar behavior would be expected from other, similar, materials. TMAH was diluted in DIW to make a solution of 2.5–5 weight %, while IPA was added to DIW to make a solution of 10–50 weight %. TMAH is supplied by CCP chemistry Co Ltd. These surfactants were not added to the slurry that was used with CMP because of their known effects on slurry characteristics. Instead, they were applied to the surface in the form of an in situ high pressure rinse. However, the flow rate of the rinsing fluid, which is controlled by a Mirra rotating pump, was increased from 100 ml/min. to 300 ml/min. This step is schematically illustrated in FIG. 5 which shows dispenser 52 squirting a jet of fluid 51 (as disclosed above) onto the surface of dielectric layer 12 after the latter has been exposed due to the removal by CMP of layers 14 and 15 (see FIG. 2). Several residual oxynitride particles 41 are also shown on the surface, said particles having not yet been exposed to jet 51. The high pressure rinse was applied for between about 5 and 20 seconds, which is substantially less time than would have been needed if DIW had been used alone.

As illustrated in FIG. 6, by using the disclosed surfactants in the concentrations stated and in the manner described, the oxynitride particles could be removed from the dielectric surface at this stage of the process. The surfactants were effective because of their effect on the surface charge, that is the isoelectric point (IEP) of oxynitride is close to 6-7, whereas that of silicon oxide, for example, is about 3. The IEP is the pH at which the net charge on a particle is zero. Accordingly, the pH was set to 9 when TMAH was used and to 8 when IPA was used. Thus, for any effective surfactant, a pH between about 8 and 11 should be used.

What is claimed is:

1. A process for removing a layer of silicon oxynitride, comprising:

providing a substrate and depositing thereon a layer of silicon oxynitride;

mounting said substrate on a platen and, using a polishing pad and a slurry, removing said layer of silicon oxynitride, thereby forming a fresh surface;

removing said polishing pad and then washing off any remaining slurry; and with said substrate still on the platen, subjecting said fresh surface to a rinse by a solution that comprises tetramethyl ammonium hydroxide, thereby removing from said fresh surface any and all residual particles of silicon oxynitride.

2. The process described in claim 1 wherein said solution that comprises tetramethyl ammonium hydroxide has a pH between about 8 and 11.

3. The process described in claim 1 wherein tetramethyl ammonium hydroxide is present in said solution at a concentration of between about 2.5 and 5 weight percent.

4. The process described in claim 1 wherein said fresh surface is subjected to said rinse for between about 5 and 20 seconds.

5. A process for removing a layer of silicon oxynitride, comprising:

providing a substrate and depositing thereon a layer of silicon oxynitride;

mounting said substrate on a platen and, using a polishing pad and a slurry, removing said layer of silicon oxynitride, thereby forming a fresh surface;

removing said polishing pad and then washing off any remaining slurry; and with said substrate still on the platen, subjecting said fresh surface to a rinse by a solution that comprises isopropyl alcohol, thereby removing from said fresh surface any and all residual particles of silicon oxynitride.

6. The process described in claim 5 wherein said solution that comprises isopropyl alcohol has a pH between about 8 and 11.

7. The process described in claim 5 wherein isopropyl alcohol is present in said solution at a concentration of between about 10 and 50 weight percent.

8. The process described in claim 5 wherein said fresh surface is subjected to said rinse for between about 5 and 20 seconds.

9. A process for forming a tungsten stud in a silicon integrated circuit, comprising:

providing a partially completed integrated circuit whose top layer is conductive;

on said conductive layer, depositing a dielectric layer;

on said dielectric layer, depositing a layer of silicon oxynitride;

on said layer of silicon oxynitride, depositing a layer of titanium nitride;

patterning and then etching said titanium nitride, silicon oxynitride, and dielectric layers to form a via hole that extends as far as said conductive layer;

over-filling said via hole with tungsten whereby a layer of tungsten, having a first thickness, covers said titanium nitride layer;

on a first platen, subjecting said tungsten layer to CMP until a second thickness of tungsten covers said titanium nitride layer;

on a second platen, subjecting said integrated circuit to CMP until all tungsten outside said via hole has been removed and until said layer of titanium nitride has also been removed;

on a third platen, subjecting said integrated circuit to CMP, using a polishing pad and a slurry, until said layer of silicon oxynitride has been removed, thereby forming a fresh surface;

removing said polishing pad and then washing off any remaining slurry; and with said integrated circuit still on said third platen, subjecting said fresh surface to a rinse by a solution that comprises a surfactant that modifies hydrophobic behavior, thereby removing from said fresh surface any and all residual particles of silicon oxynitride.

10. The process described in claim 9 wherein said solution that comprises a surfactant has a pH between about 8 and 11.

11. The process described in claim 9 wherein said surfactant is present in said solution at a concentration of between about 2 and 10 weight percent.

12. The process described in claim 9 wherein said fresh surface is subjected to said rinse for between about 5 and 20 seconds.

13. The process described in claim 9 wherein the step of subjecting said fresh surface to a rinse further comprises emitting said solution that comprises a surfactant from a dispenser at a flow rate between about 100 and 300 ml/min.

14. The process described in claim 9 wherein said layer of silicon oxynitride has a thickness between about 300 and 1,500 Angstroms.

15. A process for forming a tungsten stud in a silicon integrated circuit, comprising:

providing a partially completed integrated circuit whose top layer is conductive;

on said conductive layer, depositing a dielectric layer;

on said dielectric layer, depositing a layer of silicon oxynitride;

on said layer of silicon oxynitride, depositing a layer of titanium nitride;

patterning and then etching said titanium nitride, silicon oxynitride, and dielectric layers to form a via hole that extends as far as said conductive layer;

over-filling said via hole with tungsten whereby a layer of tungsten, having a first thickness, covers said titanium nitride layer;

on a first platen, subjecting said tungsten layer to CMP until a second thickness of tungsten covers said titanium nitride layer;

on a second platen, subjecting said integrated circuit to CMP until all tungsten outside said via hole has been removed and until said layer of titanium nitride has also been removed;

on a third platen, subjecting said integrated circuit to CMP, using a polishing pad and a slurry, until said layer of silicon oxynitride has been removed, thereby forming a fresh surface;

removing said polishing pad and then washing off any remaining slurry; and with said integrated circuit still on said third platen, subjecting said fresh surface to a rinse by a solution that comprises tetramethyl ammonium hydroxide, thereby removing from said fresh surface any and all residual particles of silicon oxynitride.

16. The process described in claim 15 wherein said solution that comprises tetramethyl ammonium hydroxide has a pH between about 8 and 11.

17. The process described in claim 15 wherein tetramethyl ammonium hydroxide is present in said solution at a concentration of between about 2.5 and 5 weight percent.

18. The process described in claim 15 wherein said fresh surface is subjected to said rinse for between about 5 and 20 seconds.

19. The process described in claim 15 wherein the step of subjecting said fresh surface to a rinse further comprises emitting said solution that comprises tetramethyl ammonium hydroxide from a dispenser at a flow rate between about 100 and 300 ml/min.

20. The process described in claim 15 wherein said layer of silicon oxynitride has a thickness between about 300 and 1,500 Angstroms.

21. The process described in claim 15 wherein said dielectric layer is silicon oxide.

22. A process for forming a tungsten stud in a silicon integrated circuit, comprising:

providing a partially completed integrated circuit whose top layer is conductive;

on said conductive layer, depositing a dielectric layer;

on said dielectric layer, depositing a layer of silicon oxynitride;

on said layer of silicon oxynitride, depositing a layer of titanium nitride;

patterning and then etching said titanium nitride, silicon oxynitride, and dielectric layers to form a via hole that extends as far as said conductive layer;

over-filling said via hole with tungsten whereby a layer of tungsten, having a first thickness, covers said titanium nitride layer;

on a first platen, subjecting said tungsten layer to CMP until a second thickness of tungsten covers said titanium nitride layer;

on a second platen, subjecting said integrated circuit to CMP until all tungsten outside said via hole has been removed and until said layer of titanium nitride has also been removed;

on a third platen, subjecting said integrated circuit to CMP, using a polishing pad and a slurry, until said layer of silicon oxynitride has been removed, thereby forming a fresh surface;

removing said polishing pad and then washing off any remaining slurry; and with said integrated circuit still on said third platen, subjecting said fresh surface to a rinse by a solution that comprises isopropyl alcohol, thereby removing from said fresh surface any and all residual particles of silicon oxynitride.

23. The process described in claim 22 wherein said solution that comprises isopropyl alcohol has a pH between about 8 and 11.

24. The process described in claim 22 wherein isopropyl alcohol is present in said solution at a concentration of between about 10 and 50 weight percent.

25. The process described in claim 22 wherein said fresh surface is subjected to said rinse for between about 5 and 20 seconds.

26. The process described in claim 22 wherein the step of subjecting said fresh surface to a rinse further comprises emitting said solution that comprises isopropyl alcohol from a dispenser at a flow rate between about 100 and 300 ml/min.

27. The process described in claim 22 wherein said layer of silicon oxynitride has a thickness between about 300 and 1,500 Angstroms.

28. The process described in claim 22 wherein said dielectric layer is silicon oxide.

* * * * *